United States Patent
Pal et al.

(10) Patent No.: US 12,004,334 B2
(45) Date of Patent: Jun. 4, 2024

(54) THERMAL MANAGEMENT SYSTEM AND METHOD OF USE

(71) Applicant: Hamilton Sundstrand Corporation, Charlotte, NC (US)

(72) Inventors: Debabrata Pal, Hoffman Estates, IL (US); Craig R. LeGros, Rockford, IL (US); Tom A. Utecht, Cherry Valley, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 353 days.

(21) Appl. No.: 17/313,746

(22) Filed: May 6, 2021

(65) Prior Publication Data

US 2021/0352832 A1 Nov. 11, 2021

Related U.S. Application Data

(60) Provisional application No. 63/020,948, filed on May 6, 2020.

(51) Int. Cl.
*H05K 7/20* (2006.01)
*H02M 7/00* (2006.01)

(52) U.S. Cl.
CPC ........ *H05K 7/20945* (2013.01); *H02M 7/003* (2013.01); *H05K 7/20909* (2013.01); *H05K 7/20927* (2013.01)

(58) Field of Classification Search
CPC ........... H05K 7/20945; H05K 7/20909; H05K 7/20927; H05K 7/20254; H02M 7/003; Y02T 50/60; F01D 25/12; F05D 2260/213; F02C 7/12; F02C 7/185
See application file for complete search history.

(56) References Cited

U.S. PATENT DOCUMENTS

| | | | |
|---|---|---|---|
| 2012/0262133 A1* | 10/2012 | Martinelli | H02M 1/15 323/234 |
| 2016/0076491 A1* | 3/2016 | Wilson | F02M 25/089 96/216 |
| 2019/0280564 A1* | 9/2019 | Pal | H02P 9/02 |
| 2019/0390603 A1* | 12/2019 | Snyder | H05K 7/203 |
| 2021/0122488 A1* | 4/2021 | Swain | F02C 6/00 |

FOREIGN PATENT DOCUMENTS

| | | | |
|---|---|---|---|
| DE | 102012007089 B4 * | 12/2015 | ............ H05K 7/206 |
| EP | 3163052 A1 | 5/2017 | |
| EP | 3537578 A1 | 9/2019 | |

OTHER PUBLICATIONS

Extended European search report issued in corresponding EP application No. 21172595.7, dated Jul. 6, 2021.

* cited by examiner

*Primary Examiner* — Emmanuel E Duke

(57) ABSTRACT

An thermal management system including, a body having a coolant passage in thermal communication with an electronic device, a first heat exchanger fluidically connected to the coolant passage configured to receive the coolant from the coolant passage, a second heat exchanger fluidically connected to the first heat exchanger, and a generator fluidically connected to the second heat exchanger.

20 Claims, 3 Drawing Sheets

THERMAL MANAGEMENT SYSTEM AND METHOD OF USE

CROSS-REFERENCE TO RELATED APPLICATIONS

This application claims priority to and the benefit of U.S. Provisional Application No. 63/020,948, filed May 6, 2020, the entire contents of which are herein incorporated by reference in their entirety.

BACKGROUND

Technological Field

The present disclosure relates to electronics thermal management, and more particularly to thermal management of a device during startup.

Description of Related Art

A variety of devices are known for providing a cooling solution for power electronics. Power electronics devices are usually mounted on a heat spreader or a cold plate or to a heat sink in order to cool them during operation. Typical packaging configurations usually result in bulky designs, which has a relatively high volume, especially for air cooled cases. The aerospace industry demands lightweight and high compactness packaging solutions while also significantly increasing power level requirements. Further, typical configurations require bypass air to cool electronics. However, during startup or other motionless activities, no bypass air is available to provide cooling to electronics.

The conventional methods and systems have generally been considered satisfactory for their intended purpose, but are not appropriate any more when due to an increase in output powers of power electronics devices and volume and/or weight constrains remaining the same. However, there is still a need in the art for a thermal management system that is able to provide an appropriate amount of cooling prior during startup. The present disclosure may provide a solution for at least one of these remaining challenges.

SUMMARY OF THE INVENTION

An aircraft thermal management system includes a body having a coolant passage defined by at least a first wall and a second wall, wherein the first wall being in thermal communication with an electronic device, a first heat exchanger fluidically connected to the coolant passage configured to receive the coolant from the coolant passage, a second heat exchanger fluidically connected to the first heat exchanger, and a generator fluidically connected to the second heat exchanger. The electronic device can be a bi-directional rectifier.

The first heat exchanger can be an air-coolant heat exchanger and a fuel-coolant heat exchanger. The second heat exchanger can be an air-coolant heat exchanger and a fuel-coolant heat exchanger. A first pump can be located downstream of the coolant passage configured to drive oil out of the coolant passage and a second pump can be located downstream of the generator configured to drive oil from the generator. The coolant can be an oil coolant. The first heat exchangers can be located within a fan casing of an aircraft engine and be coupled to a nacelle of an aircraft engine.

A method of managing heat of an electronic device on an aircraft engine includes pumping a coolant through a passage of a body coupled to an electronic device, transferring heat from the electronic device to the coolant within the passage of the body prior to aircraft engine start up, transferring heat from the coolant to a first fluid within a first heat exchanger, producing bypass airflow, and transferring heat from the coolant to a second fluid within the first heat exchanger after engine startup. The bypass air can be fan bypass air. No bypass flow is available during aircraft engine startup, and aircraft engine startup is a short-term thermal transient operation. The first fluid can be fuel and the second fluid can be air.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject invention appertains will readily understand how to make and use the devices and methods of the subject invention without undue experimentation, preferred embodiments thereof will be described in detail herein below with reference to certain figures, wherein.

DETAILED DESCRIPTION

Figure 1:
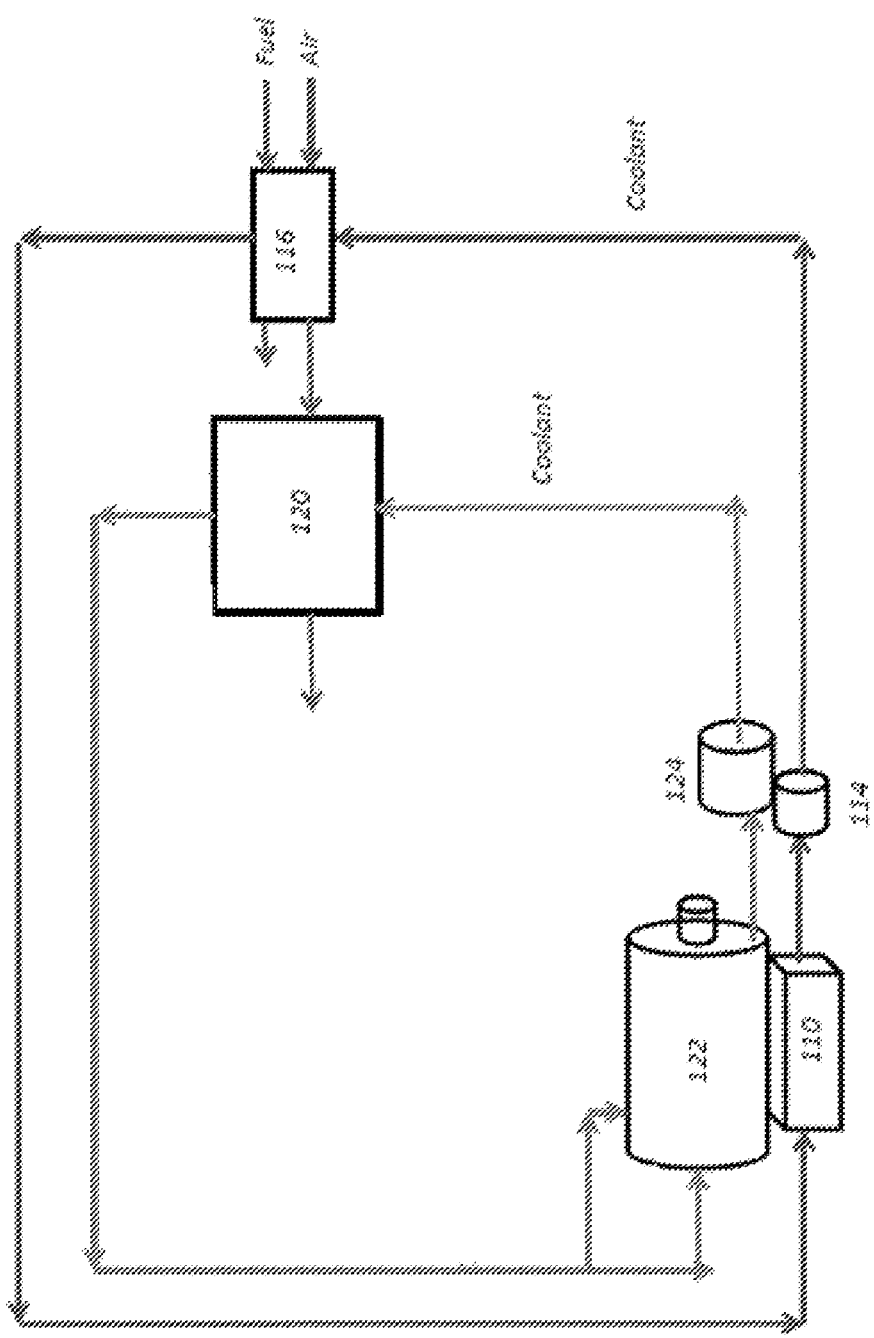
FIG. 1 is a schematic view of a thermal management system for an electronic device.

Reference will now be made to the drawings wherein like reference numerals identify similar structural features or aspects of the subject invention. For purposes of explanation and illustration, and not limitation, a partial view of an exemplary embodiment of a thermal management body in accordance with the invention is shown in FIG. 1 and is designated generally by reference character 100. Other embodiments of the thermal management body in accordance with the invention, or aspects thereof, are provided in FIGS. 2 and 3, as will be described. The methods and systems of the invention can be used to provide a more compact, lighter and more efficient electronics thermal management device which provides a, thin and low weight compact high performance cold plate based solution for bi directional rectifier cooling. Bi-directional rectifier converts DC to 3 phase AC power and supplies to the engine starter/generator in engine start mode. Bi-directional rectifier converts AC power generated by generator to high voltage DC power during generate mode.

Figure 3:
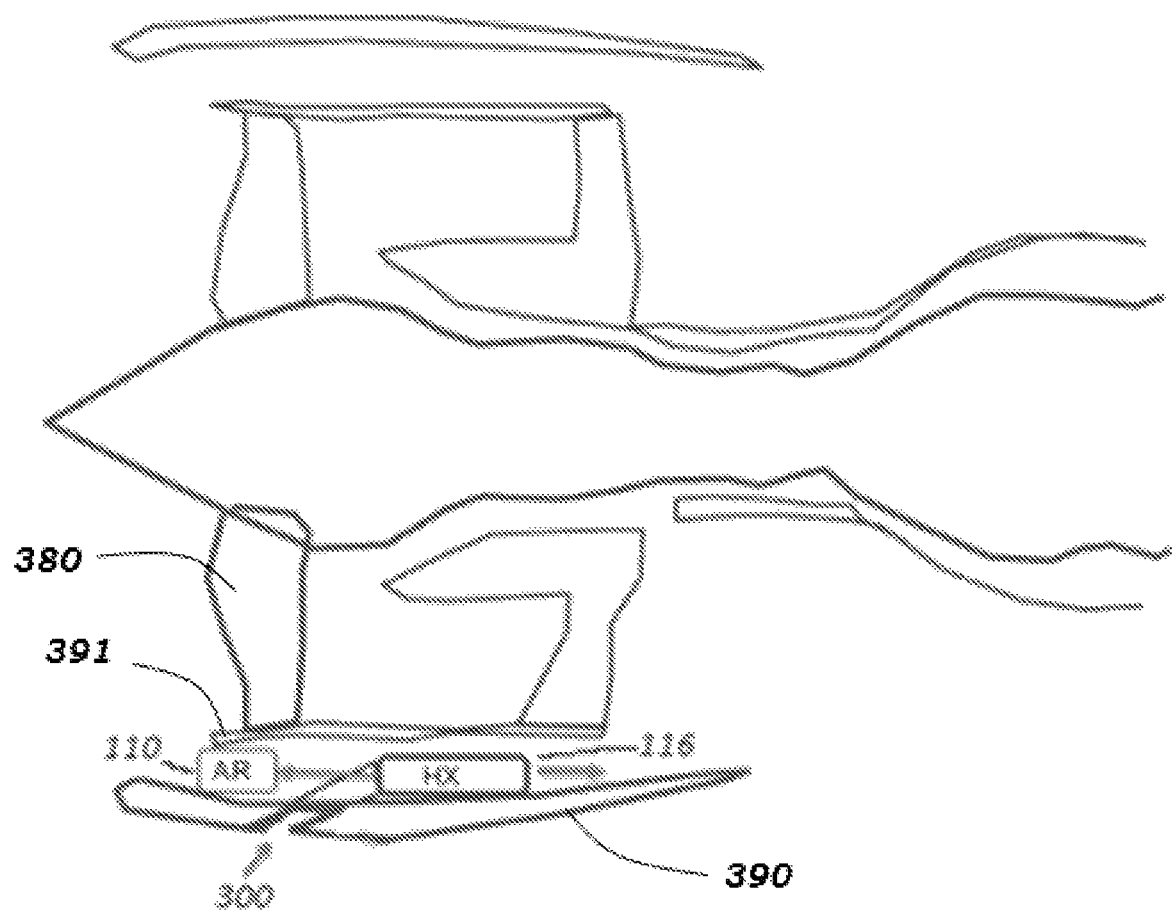
FIG. 3 is a schematic view of the thermal management system of FIG. 1 in situ.

FIG. 1 shows an aircraft thermal management 100 system an electronic device 110 such as bidirectional active rectifier. A pump 114 is placed to circulate coolant through system 100 and direct it to the first heat exchanger 116. The first heat exchanger 116 is used to cool the coolant. During ground operation and main engine start, fuel is used to cool the coolant. As the aircraft begins to move and air starts to circulate through the engine fan 380 and fan casing 391 and nacelle 390, the first heat exchanger 116 is switched to using air flow to cool the coolant passing through the first heat exchanger 116. As shown in FIG. 3, it is also considered that a nacelle scoop 300 can be opened during flight to use cold air is used to cool the coolant. After the ram air flow develops following take off, a RAM air flow scoop valve 248 will open and will provide cooling to the heat exchanger 116. Also seen in FIG. 1, a second heat exchanger 120 is fluidically connected to the first heat exchanger 116, and a generator 122 is fluidically connected to the second heat exchanger 120. The system 100 also includes a second pump 124 independent of the first pump 114, connected to the generator 122 and the second heat exchanger 120. The generator 122 received coolant to cool both the stator and rotor.

Figure 2:
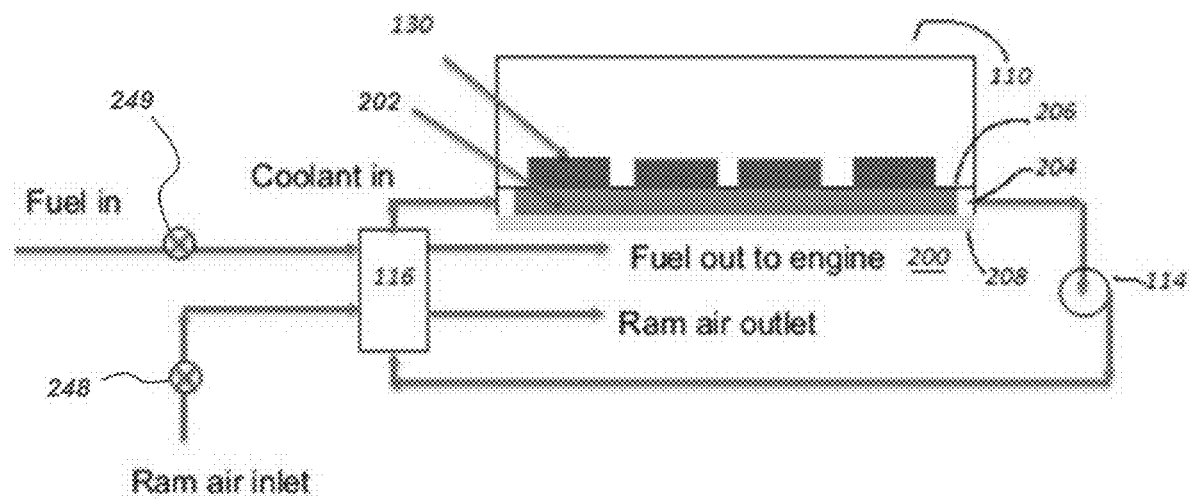
FIG. 2 is a schematic view of the electronics module of FIG. 1, showing the arrangement of the coolant passage.

FIG. 2 shows a ram air valve 248 and a fuel valve 249 controlling respective air and fuel flows to the first heat exchanger 116. FIG. 2 also shows a body 202 having a coolant passage 204 defined by at least a first wall 206 and a second wall 208. The first wall 206 is in thermal communication with the electronic device 110. The electronic device 110 is in contact with the first wall 206. The device 110 can include a series of fins protruding into the coolant passage in order to improve the heat transfer. The device 110 can include a series of power modules 130 which also contact the first wall 206 in order to be cooled more efficiently.

This method and system provides a thinner and lower weight compact high performance solution for cooling an electric member. Using this cooling approach, the bi-directional rectifier is be able to perform main engine start on ground when main fan air flow is not available. Also using RAM air flow to cool the first heat exchanger 116 provide advantage in flight; fuel is not be used for cooling during flight, thus eliminating safety concerns in using fuel for heat transfer use. In addition, using oil to cool the active rectifier will eliminate direct fuel cooling risks.

The methods and systems of the present disclosure, as described above and shown in the drawings, provide for electronics thermal management system with superior properties including increased reliability and reduced size and weight. While the apparatus and methods of the subject disclosure have been shown and described with reference to embodiments, those skilled in the art will readily appreciate that changes and/or modifications may be made thereto without departing from the spirit and score of the subject disclosure.

What is claimed is:

1. An aircraft engine thermal management system comprising:
    a body having a coolant passage in thermal communication with an electronic device and fluidically connected to a first coolant circuit;
    a first heat exchanger fluidically connected to the first coolant circuit and fluidically connected to fuel and air fluid streams, the first heat exchanger being adapted and configured to receive coolant from the first coolant circuit and to transfer heat energy from the first coolant circuit to either the fuel fluid stream during aircraft engine start up or the air fluid stream after aircraft engine start up;
    a generator fluidically connected to a second coolant circuit; and
    a second heat exchanger fluidically connected to the second coolant circuit and to the air fluid stream, the second heat exchanger being adapted and configured to receive coolant from the second coolant circuit and to transfer heat energy from the second coolant circuit to the air fluid stream.

2. The system of claim 1, wherein the electronic device includes a bi-directional rectifier.

3. The system of claim 1, wherein the first heat exchanger is an air-coolant heat exchanger and a fuel-coolant heat exchanger.

4. The system of claim 1, wherein the second heat exchanger is an air-coolant heat exchanger.

5. The system of claim 1, wherein a first pump is located downstream of the coolant passage configured to drive oil out of the coolant passage.

6. The system of claim 5, wherein a second pump is located downstream of the generator configured to drive oil from the generator.

7. The system of claim 1, wherein the coolant is an oil coolant.

8. The system of claim 1, wherein the first heat exchanger is located within a nacelle of an aircraft engine.

9. The system of claim 1, wherein the first heat exchanger is coupled to a nacelle of an aircraft engine.

10. The system of claim 1, wherein cooling of the coolant in the first heat exchanger by the fuel fluid stream is controlled by a valve on a fuel line fluidically connected to the first heat exchanger.

11. The system of claim 1, wherein cooling of the coolant in the first heat exchanger by the air fluid stream is controlled by a valve in a flow path of ram air fluidically connected to the first heat exchanger.

12. A method of managing heat of an electronic device on an aircraft engine comprising:
    pumping a coolant through a passage of a body coupled to an electronic device;
    transferring heat from the electronic Ma device to the coolant within the passage of the body prior to aircraft engine start up;
    transferring heat from the coolant to fuel within a heat exchanger;
    producing bypass air; and
    transferring heat from the coolant to air within the heat exchanger after aircraft engine start up.

13. The method of claim 12, wherein the bypass air is fan bypass air.

14. The method of claim 13, wherein there is no bypass flow during aircraft engine startup.

15. The method of claim 12, wherein the step of transferring heat from the coolant to the fuel includes the step of opening a valve on a fuel line fluidically connected to the heat exchanger.

16. The method of claim 12, wherein the step of transferring heat from the coolant to air includes the step of opening a valve in a flow path of ram air fluidically connected to the heat exchanger.

17. An aircraft engine thermal management system comprising:
    a body having a coolant passage in thermal communication with an electronic device and fluidically connected to a coolant circuit; and
    a heat exchanger fluidically connected to the coolant circuit and fluidically connected to fuel and air fluid streams, the heat exchanger being adapted and configured to receive coolant from the coolant circuit and to transfer heat energy from the coolant circuit to either the fuel fluid stream during aircraft engine start up or the air fluid stream after aircraft engine start up.

18. The system of claim 17, wherein cooling of the coolant in the heat exchanger by the fuel fluid stream is controlled by a valve on a fuel line fluidically connected to the heat exchanger.

19. The system of claim 17, wherein cooling of the coolant in the heat exchanger by the air fluid stream is controlled by a valve in a flow path of ram air fluidically connected to the heat exchanger.

20. The system of claim 19, wherein the valve is an operable nacelle scoop.

* * * * *